United States Patent [19]
Lee

[11] Patent Number: 6,084,474
[45] Date of Patent: Jul. 4, 2000

[54] AUTO GAIN CONTROLLER HAVING TEMPERATURE COMPENSATION FUNCTION

[75] Inventor: Ki Young Lee, Taegu-kwangyoksi, Rep. of Korea

[73] Assignee: LG Semicon Co., Ltd., Chungcheongbuk-Do, Rep. of Korea

[21] Appl. No.: 09/282,163

[22] Filed: Mar. 31, 1999

[30] Foreign Application Priority Data

Jun. 3, 1998 [KR] Rep. of Korea ............ 98 20638

[51] Int. Cl.⁷ .................................................. H03F 3/45
[52] U.S. Cl. ................................... 330/254; 330/256
[58] Field of Search ........................... 330/254, 256, 330/285, 289, 277, 279

[56] References Cited

U.S. PATENT DOCUMENTS

| | | | |
|---|---|---|---|
| 4,013,975 | 3/1977 | Kataoka et al. | 330/145 |
| 5,339,046 | 8/1994 | Kornfeld et al. | 330/277 |
| 5,422,593 | 6/1995 | Fujihira | 327/561 |
| 5,493,253 | 2/1996 | Ogou | 330/256 |
| 5,777,518 | 7/1998 | Bailey | 330/296 |
| 5,977,832 | 11/1999 | Satyanarayana et al. | 330/289 |

*Primary Examiner*—Robert Pascal
*Assistant Examiner*—Henry Choe
*Attorney, Agent, or Firm*—Morgan, Lewis & Bockius LLP

[57] ABSTRACT

An auto gain controller having a temperature compensation function includes a transistor having a gate terminal, a drain terminal and a source terminal, and a gain amplifier with an inversion input terminal connected to the source terminal of the transistor, a non-inversion terminal for receiving a reference signal, and an output terminal connected to the gate terminal of the transistor, wherein a gain of the grain amplifier changes in proportion with a drain current of the transistor.

9 Claims, 4 Drawing Sheets

AUTO GAIN CONTROLLER HAVING TEMPERATURE COMPENSATION FUNCTION

This Application claims the benefit of Korean application no. 20638/1998 filed on Jun. 3, 1998, which is hereby incorporated by reference.

BACKGROUND OF THE INVENTION

1. Field of the Invention

The present invention relates to an auto gain controller, and more particularly, to an auto gain controller having a temperature compensation function.

2. Discussion of the Related Art

A conventional auto gain controller having a temperature compensation function will be described with reference to the accompanying drawings.

FIG. 1 is a circuit diagram of a conventional auto gain controller having a temperature compensation function. As shown in FIG. 1, the auto gain controller includes a dual gate field effect transistor Q1 and a gain amplifier 11. A source voltage of the dual gate field effect transistor Q1 is applied to a second gate G2 through the gain amplifier 11.

When a gain is reduced due to an increase of the peripheral temperature, a drain current of the transistor Q1 is reduced, thereby reducing the source voltage of the transistor Q1. The reduced source voltage is applied to an inversion terminal of the gain amplifier 11. An output signal of the gain amplifier 11 is applied to the second gate G2 of the transistor Q1. Consequently, the drain current of the transistor Q1 increases and thus the gain of the transistor Q1 which compensates for the temperature variation increases.

FIG. 2 is a circuit diagram according to one embodiment of the conventional auto gain controller. As shown in FIG. 2, the conventional gain controller includes a receiving part 21 and a transmitting part 22.

The receiving part 21 includes a dual gate field effect transistor Q1, a gain amplifier 21b, and a differential amplifier 21a for comparing a detecting signal with a reference signal. Likewise, the transmitting part 22 includes a dual gate field effect transistor Q2 and a gain amplifier 22a.

The detecting signal of the receiving part 21 is compared with the reference signal Vref by means of the differential amplifier 21a. The resultant output signal is applied to a non-inversion input terminal of the gain amplifier 21b.

The source voltage of the field effect transistor Q1 is applied to an inversion input terminal of the gain amplifier 21b and an addition circuit 23. An output signal of the addition circuit 23 is applied to a non-inversion input terminal of the gain amplifier 22a of the transmitting part 22.

An output signal RX-$V_{GAIN\ CONT}$ of the gain amplifier 21b is applied to the second gate G2 of the transistor Q1.

The source voltage of the transistor Q2 in the transmitting part 22 is applied to the inversion input terminal of the gain amplifier 22a. An output signal of the gain amplifier 22a becomes TX-$V_{AGC}$, i.e., AGC voltage.

In the receiving part 21, the second gate G2 and the source of the transistor Q1 and the gain amplifier 21b are realized by a closed loop. Thus, temperature variations are compensated by the transistor Q1.

Likewise, in the transmitting part 22, the source and the second gate G2 of the transistor Q2 and the gain amplifier 22a are realized by a closed loop, so that temperature variations are compensated by the transistor Q2.

The temperature compensated signal from the transistor Q1 of the receiving part 21 is provided to the gain amplifier 22a of the transmitting part 22 through the addition circuit 23. Thus, the gain variation of the amplifier due to the peripheral temperature variation is reduced. The transmitting power source is accurately controlled by the receiving signal level. This prevents speech quality from being deteriorated due to variation of the transmitting power source.

However, the aforementioned conventional auto gain controller has several problems. If noise occurs when the receiving signal is input to the receiving part, the drain current of the transistor Q1 varies, thereby causing noise to occur in the output signal. In other words, the drain current of the transistor Q1 varies in accordance with the variation of the input signal, so that the current which flows to the gain amplifier also varies. As a result, the output signal becomes nonlinear.

SUMMARY OF THE INVENTION

Accordingly, the present invention is directed to an auto gain controller having a temperature compensation function that substantially obviates one or more of the problems due to limitations and disadvantages of the related art.

An object of the present invention is to provide an auto gain controller having a temperature compensation function, in which a current uniformly flows to a gain amplifier even if noise occurs in an input signal, so that a constant gain is achieved despite of the peripheral temperature variation and input signal variation.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as he appended drawings.

To achieve these and other advantages and in accordance with the purpose of the present invention, as embodied and broadly described, an auto gain controller having a temperature compensation function according to the present invention includes a transistor having a gate terminal, a drain terminal and a source terminal, and a gain amplifier of which an inversion input terminal is connected to the source terminal of the transistor, a non-inversion terminal receives a reference signal, and an output terminal is connected to the gate terminal of the transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
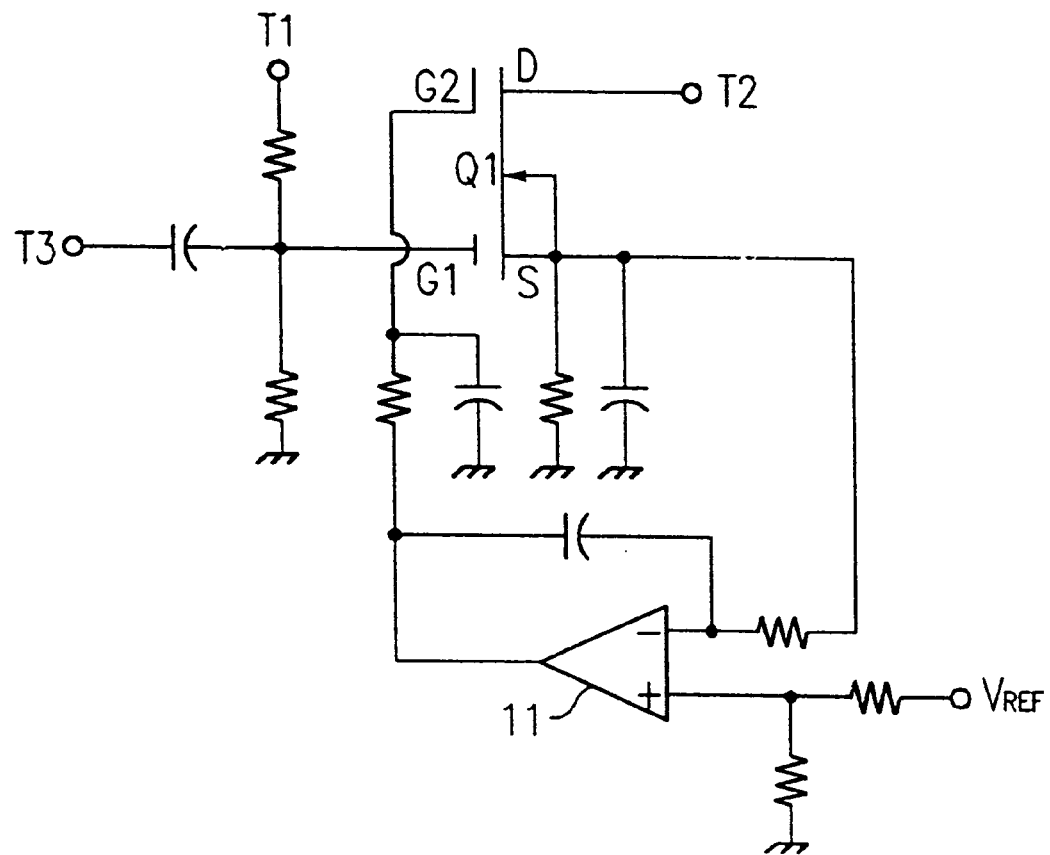
FIG. 1 is a circuit diagram of a conventional auto gain controller having a temperature compensation function.
Figure 2:
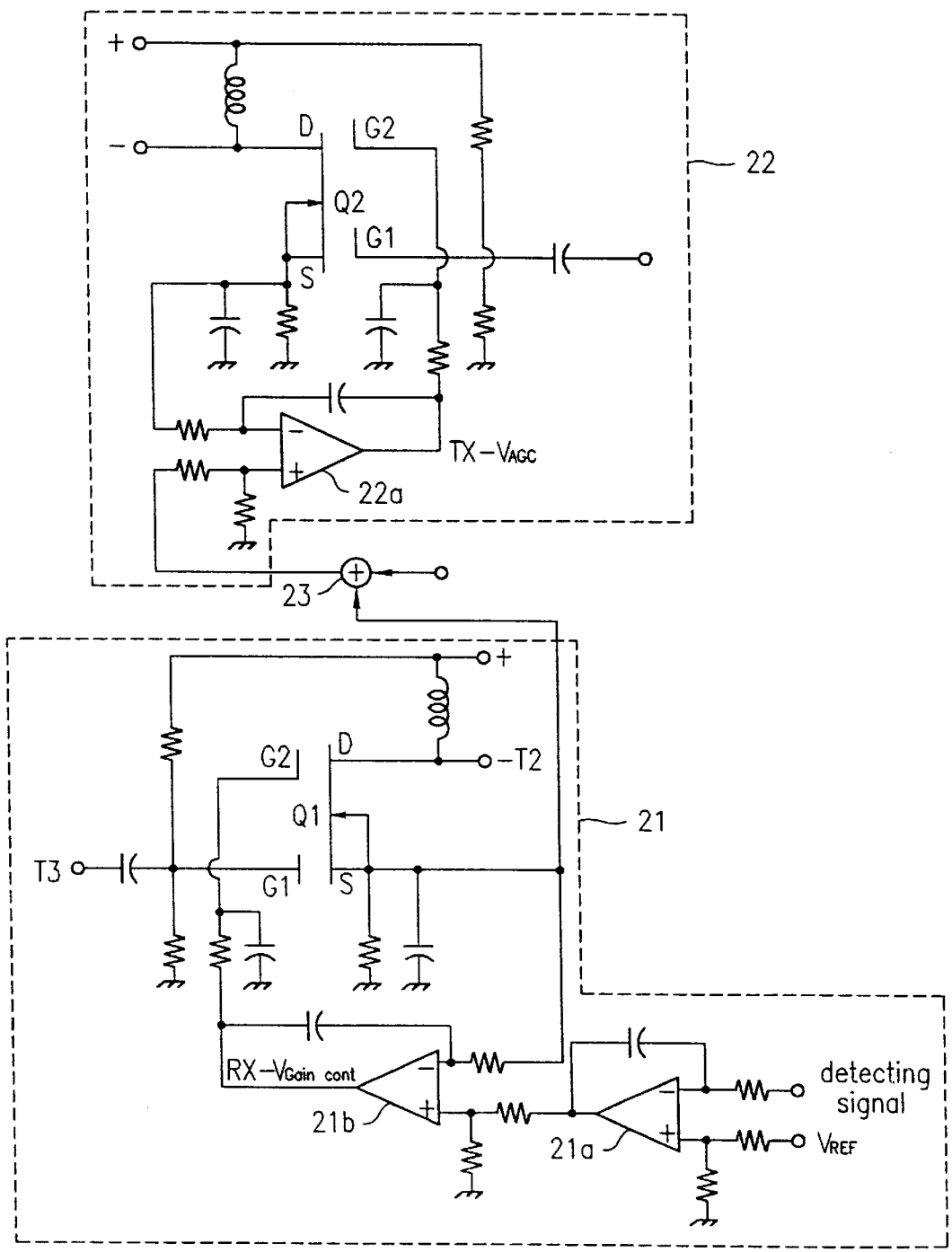
FIG. 2 is a circuit diagram illustrating an embodiment of a conventional auto gain controller having a temperature compensation function.
Figure 3:
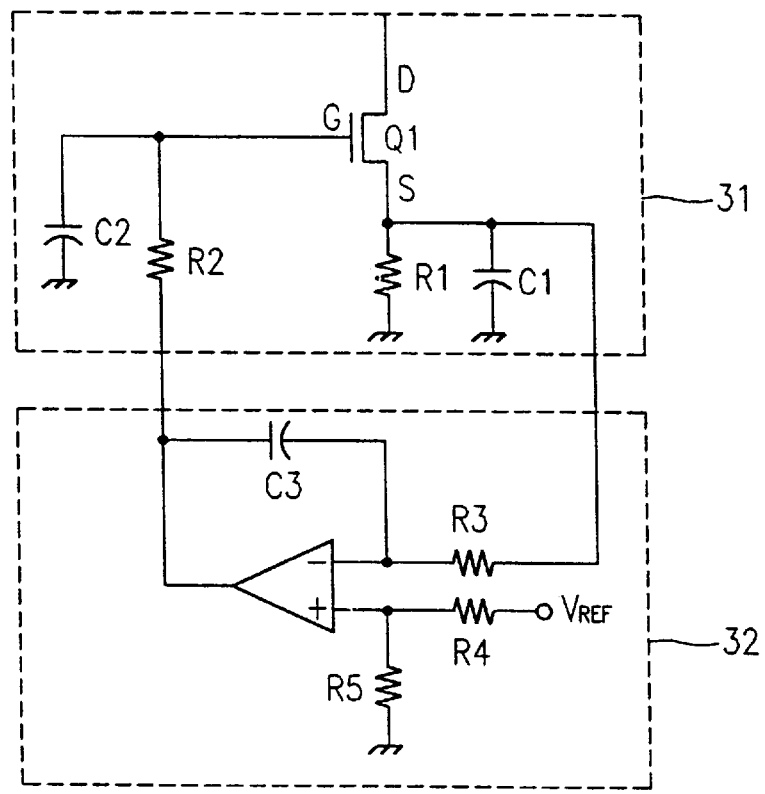
FIG. 3 is a circuit diagram of an auto gain controller having a temperature compensation function according to the present invention.

As shown in FIG. 3, an auto gain controller having a temperature compensation function according to the present invention includes a bias portion 31 and a gain amplifier 32.

The bias portion 31 includes a transistor Q1 having a gate G, a source S and a drain D, a resistor R1 and a capacitor C1. The resistor R1 and the capacitor C1 are in parallel connected to the source terminal of the transistor Q1. The gain amplifier 32 compares an output signal of the bias portion 31 with a reference signal $V_{REF}$ and amplifies the resultant signal. The output signal from the gain amplifier 32 is sent to the gate terminal G of the transistor Q1 through a resistor R2. A capacitor C2 is also connected to the gate G of the transistor Q1.

The source voltage of the transistor Q1 is applied to an inversion input terminal of the gain amplifier 32 through a resistor R3. The reference signal $V_{REF}$ is applied to a non-inversion input terminal of the gain amplifier 32. The gain amplifier 32 compares and integrates the reference voltage $V_{REF}$ applied to the non-inversion input terminal with the source voltage of the transistor Q1 of the bias portion 31.

A capacitor C3 is connected between the inversion input terminal of the gain amplifier 32 and its output terminal. Resistors R4 and R5 are in parallel connected to the non-inversion input terminal of the gain amplifier 32.

If the peripheral temperature varies, the drain current of the transistor Q1 also varies. As a result, the source voltage of the transistor Q1 varies. If the varied source voltage is applied to the inversion input terminal of the gain amplifier 32, the gain of the gain amplifier 32 also varies. Consequently, the drain current of the transistor Q1 and the gain are closely related with each other.

Figure 4:
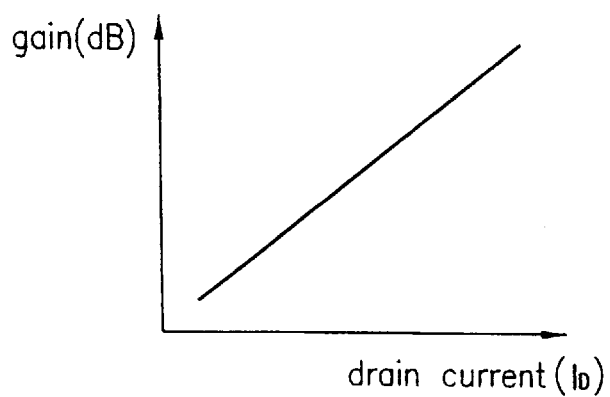
FIG. 4 is a graph illustrating a relationship between a gain and a drain current according to the present invention.

As shown in FIG. 4, if the drain current is reduced, the gain is reduced. Similarly, if the drain current increases, the gain increases. As a result, the gain of the auto gain controller varies in accordance with the drain current of the transistor Q1 of the bias portion 31.

If the peripheral temperature varies, the gain also varies so that the drain current of the transistor Q1 varies accordingly. Therefore, if a variation of the drain current of the transistor Q1 is detected, a variation of the gain can also be detected.

To detect the drain current of the transistor Q1, the source voltage of the transistor Q1 is detected. In other words, as shown in FIG. 3, the source voltage of the transistor Q1 is applied to the gate of the transistor Q1 through the gain amplifier 32 realized by a closed loop.

Thus, if the peripheral temperature increases, the drain current of the transistor Q1 is reduced. The source voltage is reduced as the drain current of the transistor Q1 is reduced.

The reduced source voltage is provided to the inversion terminal of the gain amplifier 32 and is compared and integrated with the reference voltage $V_{REF}$ applied to the non-inversion input terminal.

The compared and integrated output voltage of the gain amplifier 32 is again applied to the gate of the transistor Q1, so that the drain current of the transistor Q1 increases. As a result, the drain current is maintained uniformly as shown in FIG. 4.

As described above, the reduction of the gain due to the variation of the peripheral temperature can thus be compensated.

Figure 5:
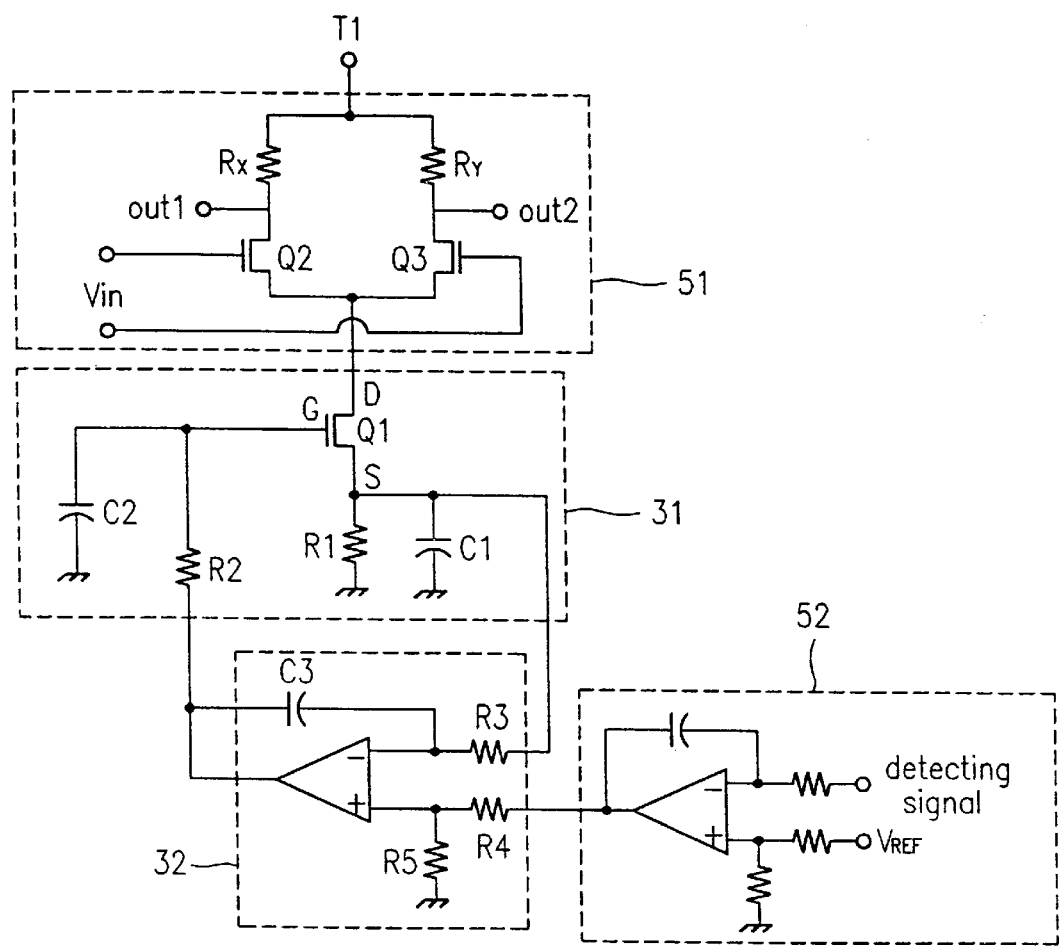
FIG. 5 is a circuit diagram illustrating an embodiment of the auto gain controller having a temperature compensation function according to the present invention.

FIG. 5 is a circuit diagram illustrating an embodiment of the auto gain controller having a temperature compensation function according to the present invention.

As shown in FIG. 5, the auto gain controller having a temperature compensation function includes a bias input portion 51, a bias portion 31, a gain amplifier 32, and a differential amplifier 52.

The differential amplifier 52 outputs the reference signal to the gain amplifier 32. The bias input portion 51 applies a bias current to the bias portion 31.

A power source is applied to the bias input portion 51 through T1 terminal. The applied power source is divided and passes through load resistors Rx and Ry. The load resistors Rx and Ry can be replaced with a coil or a transistor, such as a field effect transistor.

The drain of the transistor Q2 is connected to the resistor Rx and the drain of the transistor Q3 is connected to the resistor Ry. The source of the transistor Q2 and the source of the transistor Q3 are connected in common to the drain of the transistor Q1 of the bias portion 31.

The source voltage corresponding to the drain current of the transistor Q1 of the bias portion 31 is applied to the inversion input terminal of the gain amplifier 32 through the resistor R3. The output signal of the gain amplifier 32 is applied to the gate of the transistor Q1 through the resistor R2.

The output signal of the differential amplifier 52 is applied to the non-inversion input terminal of the gain amplifier 32.

A detecting signal input to the auto gain controller is applied to the inversion input terminal of the differential amplifier 52, while the reference signal $V_{REF}$ is applied to the non-inversion input terminal thereof.

The bias input portion 51 includes two load resistors Rx and Ry and two transistors Q2 and Q3 and serves as a differential amplifier. Difference in values between a positive (+) signal input to the gate of the transistor Q2 and a negative (−) signal input to the gate of the transistor Q3 are amplified, while the signal of the same phase is not amplified.

In other words, the bias input portion 51 outputs an voltage difference between the positive signal and the negative signal through the output terminals Out1 and Out2 and applies the same phase signal to the bias portion 31 through the transistors Q2 and Q3.

Therefore, the current applied to the bias portion 31 is maintained uniformly even if noise occurs in the input signal applied to the gates of the transistors Q2 and Q3. This means that the drain current of the transistor Q1 is maintained uniformly.

In the present invention, since the gain of the gain amplifier is closely related with the drain current of the transistor Q1, the gain of the input signal which causes noise can be effectively controlled by controlling the drain current uniformly using the differential amplifier.

The auto gain controller having a temperature compensation function of the present invention has the following advantages. Since the bias input portion serves as a differential amplifier, variation of the peripheral temperature can be compensated and a uniform gain can be obtained regardless of noise even if noise occurs in the input signal. In addition, since the gain amplifier is a differential amplifier, even harmonics are removed at the output terminals Out1 and Out2, thereby obtaining a lineal output signal.

It will be apparent to those skilled in the art that various modifications and variations can be made in the auto gain controller having a temperature compensation function according to the present invention without departing from the spirit or scope of the invention. Thus, it is intended that the present invention covers the modifications and variations of the invention provided they come within the scope of the appended claims and their equivalents.

What is claimed is:

1. An auto gain controller having a temperature compensation function comprising:
    a bias portion including a transistor having a gate terminal, a drain terminal and a source terminal, the source terminal connected with a first capacitor and a resistor in parallel, and the gate terminal connected with a second capacitor;
    a gain amplifier for comparing an output signal of the bias portion with a reference signal and sending a resultant signal to the gate terminal;
    a differential amplifier for outputting the reference signal to the gain amplifier; and
    a bias input portion for applying a bias current to the bias portion, wherein the bias input portion serves as a differential amplifier.

2. The auto gain controller as claimed in claim 1, wherein the differential amplifier includes a non-inversion input terminal for receiving the reference signal, and an inversion input terminal for receiving an externally applied input signal.

3. The auto gain controller as claimed in claim 1, wherein the bias input portion includes:
    first and second transistors with drain terminals connected to the first and second load resistors respectively, and with source terminals connected in common to an input terminal of the bias portion.

4. The auto gain controller as claimed in claim 3, wherein the first transistor includes one of a coil, a load resistor, and a field effect transistor.

5. The auto gain controller as claimed in claim 3, wherein the second transistor includes one of a coil, a load resistor, and a field effect transistor.

6. The auto gain controller as claimed in claim 1, wherein the gate terminal of the transistor and the second capacitor are in parallel connected with an output terminal of the gain amplifier.

7. The auto gain controller as claimed in claim 1, further comprising a resistor between the source terminal of the transistor and an inversion input terminal of the gain amplifier.

8. The auto gain controller as claimed in claim 1, further comprising a resistor between the gate terminal of the transistor and an output terminal of the gain amplifier.

9. The auto gain controller as claimed in claim 1, further comprising a capacitor between, inversion input terminal of the gain amplifier and an output terminal of the gain amplifier.

* * * * *